(12) United States Patent
Sugita et al.

(10) Patent No.: US 7,982,217 B2
(45) Date of Patent: Jul. 19, 2011

(54) SEMICONDUCTOR DEVICE AND ITS TEST METHOD

(75) Inventors: Norihiko Sugita, Ann Arbor, MI (US); Tetsuo Ishiguro, Sayama (JP); Naoki Yashiki, Kodaira (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 12/153,746

(22) Filed: May 23, 2008

(65) Prior Publication Data
US 2008/0237592 A1 Oct. 2, 2008

Related U.S. Application Data

(63) Continuation of application No. 10/468,794, filed on Aug. 22, 2003, now abandoned.

(30) Foreign Application Priority Data

Mar. 19, 2001 (JP) .................................. 2001-078112

(51) Int. Cl.
*H01L 21/66* (2006.01)
(52) U.S. Cl. ........................................................ 257/48
(58) Field of Classification Search ...................... None
See application file for complete search history.

(56) References Cited

U.S. PATENT DOCUMENTS

| | | | | |
|---|---|---|---|---|
| 5,148,391 A | * | 9/1992 | Zagar | 365/96 |
| 5,189,641 A | * | 2/1993 | Arakawa | 365/185.08 |
| 5,392,394 A | * | 2/1995 | Hamana | 345/504 |
| 5,553,247 A | * | 9/1996 | Lallement | 710/113 |
| 6,079,015 A | * | 6/2000 | Harwood et al. | 712/244 |

FOREIGN PATENT DOCUMENTS

| | | | |
|---|---|---|---|
| JP | 64-19599 | | 7/1987 |
| JP | 5-13662 | | 7/1991 |
| JP | 05-061817 | | 9/1991 |
| JP | 05061817 A | * | 3/1993 |
| JP | 7-14392 | | 8/1993 |
| JP | 8-334544 | | 6/1995 |
| JP | 10-38977 | | 7/1996 |
| JP | 10-038977 | | 7/1996 |
| JP | 11-259330 | | 3/1998 |
| JP | 11-344537 | | 6/1998 |
| JP | 2000-022072 | | 7/1998 |
| JP | 2000-111617 | | 10/1998 |
| JP | 11259330 A | * | 9/1999 |

OTHER PUBLICATIONS

Korean Patent Office Office Action dated Jun. 29, 2008, in Korean.
Japanese Office Action dated May 9, 2007 regarding Japanese Patent Application No. 2002-573697, in Japanese with English translation.
International Search Report from the Japanese Patent Office, dated Aug. 20, 2002.
English translation of JP11344537, Dec. 14, 1999, Okabe.

* cited by examiner

*Primary Examiner* — David E Graybill
(74) *Attorney, Agent, or Firm* — Stites & Harbison PLLC; Juan Carlos A. Marquez, Esq.

(57) ABSTRACT

A second semiconductor chip including the operation of receiving operation instructions given from a first semiconductor chip and outputting a signal corresponding to it is mounted on mounting means. Internal wirings for interconnecting the first and second semiconductor chips, and external terminals respectively connected to the internal wirings are provided in the mounting means to constitute a multi chip module. Further, a signal path for selectively invalidating operation instructions from the first semiconductor chip to the second semiconductor chip is provided inside the module.

5 Claims, 12 Drawing Sheets

FIG. 10
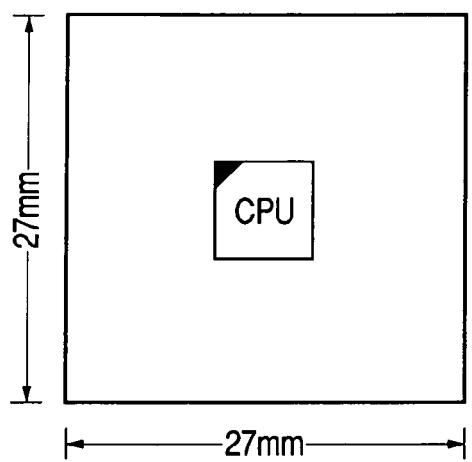 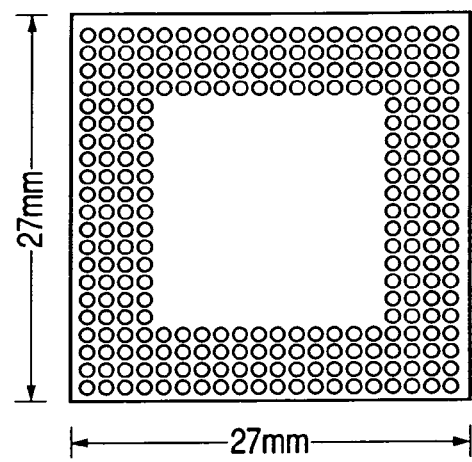
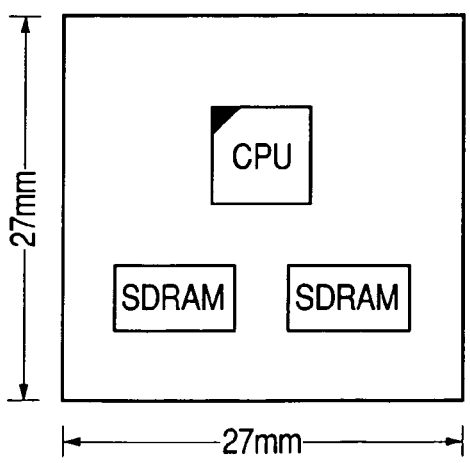 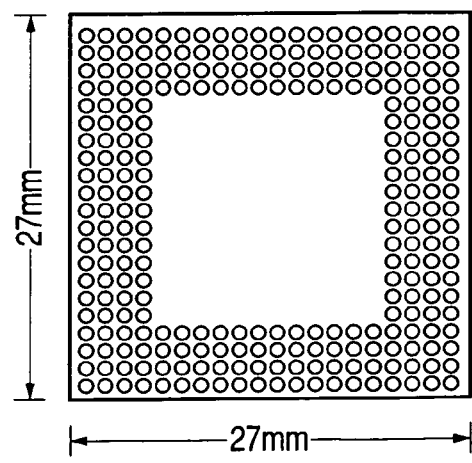

SEMICONDUCTOR DEVICE AND ITS TEST METHOD

CROSS REFERENCE TO RELATED APPLICATIONS

This application is a Continuation of U.S. patent application Ser. No. 10/468,794, filed Aug. 22, 2003 now abandoned. Priority is claimed based on U.S. patent application Ser. No. 10/468,794, filed Aug. 22, 2003, which claims priority to Japanese Patent Application No. 2001-078112 filed on Mar. 19, 2001, all of which is hereby incorporated by reference.

TECHNICAL FIELD

The present invention relates to a semiconductor device and its test method, and to a technology effective if applied to a semiconductor device integrally formed as a substantially one semiconductor integrated circuit device by mounting a plurality of semiconductor chips having several different functions on one mounting substrate, for example, and to its test method.

BACKGROUND ART

In a so-called multi chip module technology, a plurality of semiconductor chips are mounted on such a mounting substrate as to have a plurality of internal wirings and a plurality of external terminals. The plurality of semiconductor chips and the mounting substrate are brought into an integrated device. Electrical connections between the semiconductor chips and external terminals, and electrical connections mutually necessary for the plurality of semiconductor chips are done by internal wirings in the mounting substrate. A multi chip module constituted as an integral or one semiconductor device is tested if it has required functions.

The invention related to a bare chip failure detecting device for a multi chip module has been disclosed in Japanese Unexamined Patent Publication No. Hei 8 (1996)-334544. According to the invention described in the same publication, a bare chip and a package chip having the same logic structure as the bare chip are mounted on a test board. A decision as to whether or not the bare chip is good, is performed by a comparison between both output signals. Described more specifically, the technology disclosed in the same publication intends to disable others of a plurality of package chips and a plurality of bare chips except for ones thereof, and compare signals of both chips associated with each other to thereby specify a defect in bare chip (it is called a prior art 1).

One wherein semiconductor chips mounted in a multi chip module are respectively provided with structures for individually supplying a power supply thereto, and only the semiconductor chips to be tested are individually tested by supplying the power supply to the semiconductor chips alone, has been proposed in Japanese Unexamined Patent Publication No. 2000-111617 (it is called a prior art 2).

There has been proposed in Japanese Unexamined Patent Publication No. 2000-22072 and Japanese Unexamined Patent Publication No. Hei 5 (1993)-13662, one wherein a multi chip module is provided with an input path and an output path for testing and has terminals for performing switching between the paths upon the normal operation and testing, and the function of performing switching between the input path and output path for the testing and normal operation is provided within a chip constituting the multi chip module, or a multi chip module is newly added as a chip constitutive of the multi chip module (it is called a prior art 3).

Advances in semiconductor technology are now creating the orientation of a technology which intends to constitute a plurality of semiconductor chips for constituting an electronic system, like a chip for microcomputer, a DRAM chip, and a flash memory chip as a semiconductor device configured in one package form as a whole.

Namely, when a plurality of semiconductor devices are used wherein individual semiconductor chips rather than a plurality of semiconductor chips are packaged by a normal package technology such as a technology for QFP (Quad Flat Package), CSP (Chip Size Package or Chip Scale Package), or BGA (Ball Grid Array), and they are implemented on a mounting substrate like a printed board, decreasing the distance between the semiconductor chips and their wiring distances becomes difficult, and hence a signal delay due to wiring increases, thus causing restrictions in the speeding up and downsizing of each device.

On the other hand, in a multichip (Multi Chip Module) technology, a plurality of semiconductor chips significantly brought into small form, each of which is referred to as a so-called bare chip, are formed as a semiconductor device configured in one package form. Therefore, the wiring distance between the respective chips can be shortened, and the characteristic of the semiconductor device can be enhanced. Bringing a plurality of chips to one package makes it possible to bring a semiconductor device into less size and decrease its mounting areas to thereby scale down the semiconductor device.

It is desirable that as in, for example, a microcomputer chip, and a DRAM or rush memory chip connected to such microcomputer chip, ones closely associated with one another are selected as semiconductor chips for constituting a multi chip module. When such combinations of plural semiconductor chips closely associated with one another are selected, the characteristic of the multi chip module can be fully utilized. It is desirable that both a test on the function of such a whole multi chip module and a test on each individual chip itself can be carried out.

However, the prior arts 1 through 3 do not pay any attention to the characteristic of the multi chip module referred to above and gives consideration only to exclusively operating the individual chips independently. In the prior art 1, for example, neither of the operation of only the microcomputer chip at the operation that when the microcomputer chip is operated, a memory circuit responds to it, and a complex test on the accessing of the microcomputer chip to a built-in memory circuit can be carried out.

Since the power supply is distributed in the prior art 2, the prior art 2 still gives consideration only to independent tests on the individual semiconductor chips. In addition, the prior art 2 do not pay attention to a signal leak developed via each semiconductor chip supplied with no operating voltage and is not capable of determining whether a semiconductor chip intended for testing is defective or it is faulty due to a signal leak developed via a power-off semiconductor chip. Besides, the prior art 2 has the fear that since the power supply for the respective semiconductor chips is separately supplied thereto during the normal operation, a small potential difference in power supply voltage between the semiconductor chips results in an offset upon the transfer of a signal between the semiconductor chips, and reflection-based noise occurs in a signal transferred across a power cutoff portion to thereby deteriorate noise resistance at a high-speed operation, thus bringing about an adverse effect that impairs an original merit of a multi chip module.

Even the prior art 3 still has a problem in that it pays attention only to independent tests on the individual semiconductor chips, and a substantial increase in external terminal occurs, and the period and cost necessary to develop novel chips increase, or the chips constituting the multi chip module increase due to the addition of the chips each having the function of switching between the input path and the output path, thus resulting in an increase in manufacturing cost.

An object of the present invention is to provide a semiconductor device which enables a high-reliability test while maintaining the performance of a multi chip module, and its test method. The above, other objects and novel features of the present invention will become apparent from the description of the present specification and the accompanying drawings.

DISCLOSURE OF THE INVENTION

A summary of a representative one of the inventions disclosed in the present application will be explained in brief as follows: A second semiconductor chip including the operation of receiving operation instructions from a first semiconductor chip and outputting a signal corresponding to it, is mounted on mounting means, and internal wirings for interconnecting the first and second semiconductor chips with each other and external terminals respectively connected to the internal wirings are provided in the mounting means to thereby constitute a multi chip module. Further, a signal path for selectively invalidating operation instructions from the first semiconductor chip to the second semiconductor chip is provided inside the module.

A summary of another representative one of the inventions disclosed in the present application will be explained in brief as follows: There is provided a method of testing a semiconductor device wherein a second semiconductor chip including the operation of receiving operation instructions from the first semiconductor chip and outputting a signal corresponding thereto is mounted on a mounting means, internal wirings for interconnecting the first and second semiconductor chips with each other and external terminals respectively connected to the internal connections are provided in the mounting means to constitute a multi chip module, and a signal path for selectively invalidating operation instructions from the first semiconductor chip to the second semiconductor chip is provided inside the module, which comprises invalidating the operation instructions from the first semiconductor chip to the second semiconductor chip, and carrying out an operation test directed from the first semiconductor chip to the second semiconductor chip between the first semiconductor chip and a test device connected to the corresponding external terminal.

BRIEF DESCRIPTION OF THE DRAWINGS

FIG. 10 is a configuration diagram showing one embodiment of a multi chip module according to the present invention;

BEST MODE FOR CARRYING OUT THE INVENTION

In order to describe the present invention in more details, the present invention will be described in accordance with the accompanying drawings.

Figure 1:
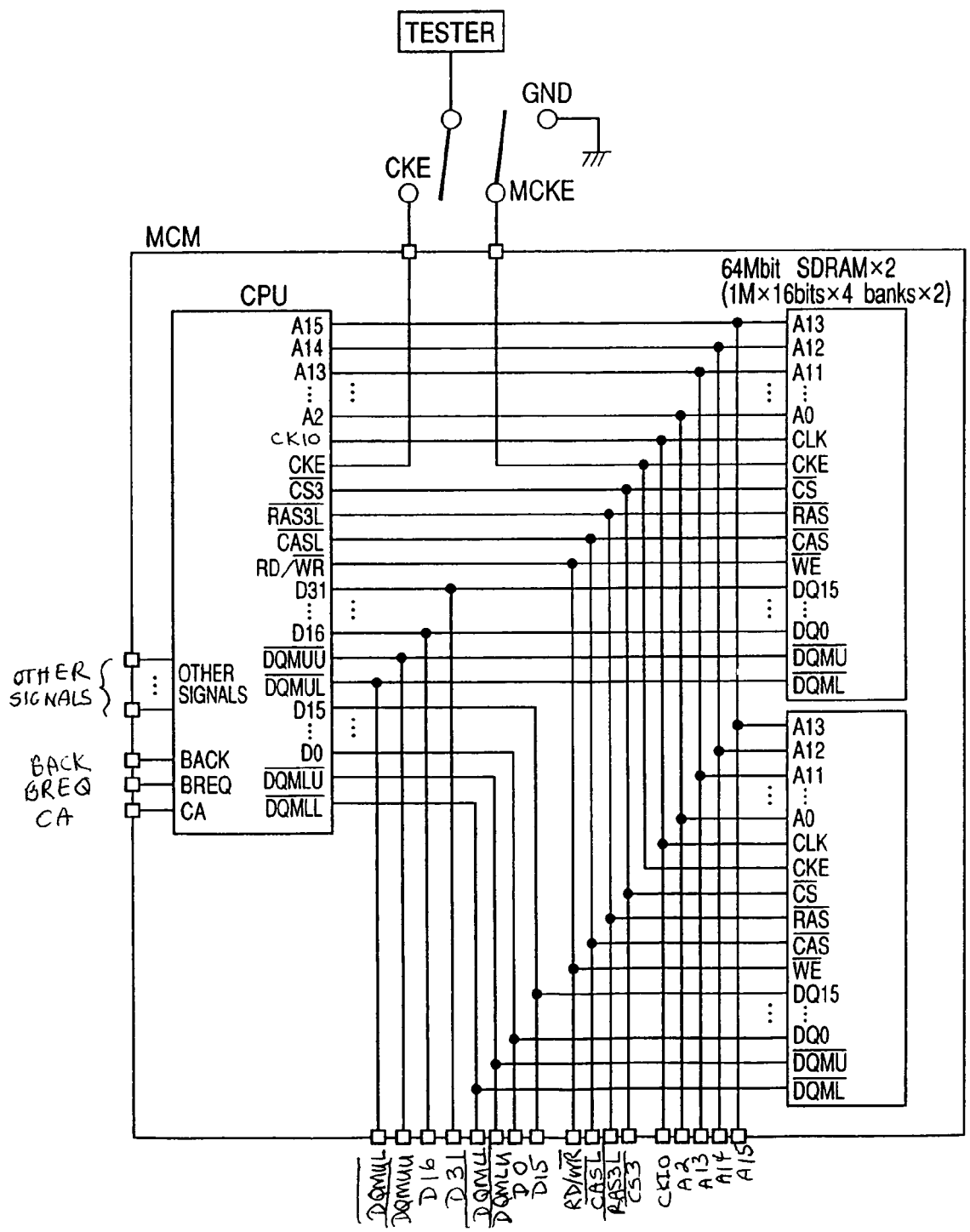
FIG. 1 is a schematic block diagram for describing one embodiment illustrative of a semiconductor device according to the present invention and its test method.

A schematic block diagram for describing one embodiment illustrative of a semiconductor device according to the present invention and its test method is shown in FIG. 1. A multi chip module MCM according to the present embodiment comprises a central processing unit (hereinafter called simply CPU) and two (Synchronous Dynamic Random Access Memories; hereinafter called simply SDRAMs). One of the SDRAMs has a memory capacity of about 64 Mbits made up of 1M (Mega)×16 bits×4 banks. Data terminals comprising 16 bits are divided into and connected to an upper order U and a lower order L of a data bus comprising 32 bits. Thus, memory access for 1M×32 bits×4 banks is performed as viewed from the CPU.

While the multi chip module MCM will be described later using FIG. 8 and FIGS. 10 through 12 as to its structure, the outline thereof will be explained as follows: The multi chip module MCM has a semiconductor chip constituting a CPU, two semiconductor chips constituting two SDRMAs, and a mounting substrate for mounting those semiconductor chips thereon.

A plurality of semiconductor chips are mounted on the main surface side with one of the mounting substrate as the main surface side. A plurality of external terminals of the multi chip module MCM are disposed on the other main surface side of the mounting substrate. This configuration makes it possible to bring the multi chip module into a relatively compact size, regardless of areas occupied by the plurality of semiconductor chips, and areas necessary to arrange the plurality of external terminals.

Each of the semiconductor chips is made up of a so-called bare chip and has such plural bump electrodes so as to be surface-mountable on the mounting substrate. Each semiconductor chip is configured as necessary by such a technology as referred to as an area-array pad, i.e., a technology for forming wirings enabling relocation of pad electrodes through such an insulating film as made of a polyimide resin, on a semiconductor chip with elements and wirings completed thereon, and forming the pad electrodes in such wirings. By virtue of the area array pad technology, pad electrodes arranged in relatively small pitches like several tens of μm to 100 μm pitches as external terminals employed in each semiconductor chip are respectively set so as to range from 0.1 mm to 0.2 mm in diameter and converted to bump electrode arrangements at relatively large pitches like 400 μm to 600 μm pitches. The area array pad technology is effective in surface-mount chipping the semiconductor chip like an SDRAM, wherein the arrangement of its input/output circuit and pad electrodes in the center of the semiconductor chip is suitable.

The mounting substrate has such an insulating substrate as made of glass epoxy or glass, such relatively fine internal wirings as formed of multilayered wiring constructions formed on the insulating substrate, a plurality of lands to be electrically connected to bump electrodes of a semiconductor chip, and a plurality of external terminals. More preferably, the mounting substrate is coated with such an insulation protective coating as made of an organic resist material on a main surface thereof on the semiconductor chip mounting side except for above the lands.

The external terminals are formed of such bump electrodes as electrically connected to the internal wirings through holes defined in the insulating substrate. The bump electrodes employed in the semiconductor chip are configured in relatively small sizes and relatively small pitches in which they may be referred to as micro bumps, whereas the bump electrodes serving as the external terminals on the mounting substrate are configured in relatively large sizes and relatively large pitches. A plurality of semiconductor chips are mounted on the mounting substrate by a surface mounting technology. A protective material referred to as so-called underfill is charged between the surface-mounted semiconductor chip and the mounting substrate.

The semiconductor chips employed in the multi chip module MCM are subjected to a so-called semiconductor wafer test in a manner similar to the normal semiconductor device manufacturing process to avoid the use of needless ones assumed to be defective in advance, that is, their electrical characteristics are tested through a probe at a stage of a semiconductor wafer prior to being divided into the respective semiconductor chips, and ones judged to be non-defective are used. As to the mounting substrate as well, one judged to be non-defective in advance is similarly used. However, for instance, the wafer test is not necessarily a sufficient test due to various technical restrictions.

The occurrence of a failure in connection, and the possibility of a change in device characteristic due to a mechanical stress containing a thermal stress are also included upon assembly of the multi chip module. Therefore, a test on the post-assembly multi chip module is essential. Screening like burn-in and its subsequent test, i.e., a burn-in test are included in the stricter manufacture of the semiconductor device.

In order to enable a test with a high degree of reliability while taking advantage of the characteristics of the multi chip module MCM in which such a CPU and an SDRAM as shown in FIG. 1 are combined with each other, the CPU (chip for microcomputer) and the SDRAM are interconnected with address buses, data buses and control buses formed on the mounting substrate constituting the multi chip module MCM. For instance, the address buses comprise 14 address buses associated with address terminals A0 through A13 of the SDRAM, and the data buses comprises 32 data buses associated with data terminals DQ0 through DQ15 of the two SDRAMs. In the CPU, address terminals of A2 through A15 are respectively connected to the above address buses, and D0 through 15 and D16 through D31 are respectively connected to the above data buses.

The CPU has respective control output terminals of CKIO, CKE, CS3B, RAS3LB, CASLB, RD/WRB, DQMUUB and DQMULB, and DQMLUB and DQMLL associated with the SDRAM. They are respectively connected to CLK, CKE, CSB, RASB, CASB, WEB, and DQMU and DQBL of the SDRAM. Here, those whose terminal names are marked with B, respectively correspond to logic symbols which take low levels represented by placing over bars on the terminal names on the drawing as active levels. The terminals DQMUB and DQMULB, and DQMLUB and DQMLL are respectively mask signals and divide the data buses comprising the above 32 bits into four sets 8 bits by 8 bits. Selective mask is done by the DQMUUB and DQMULB, and DQMLUB and DQMLL.

Figure 11:
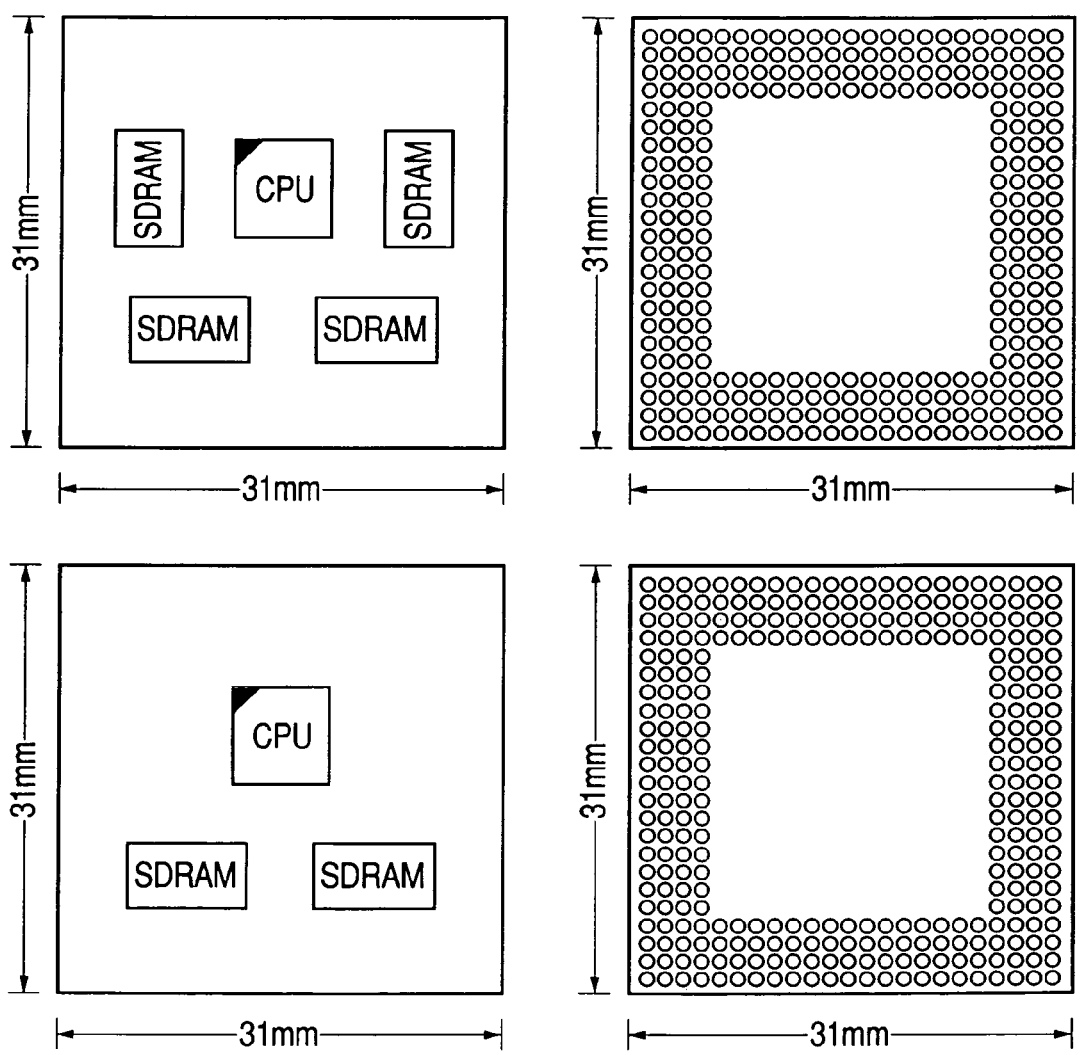
FIG. 11 is a configuration diagram illustrating another embodiment of a multi chip module according to the present invention.
Figure 12A:
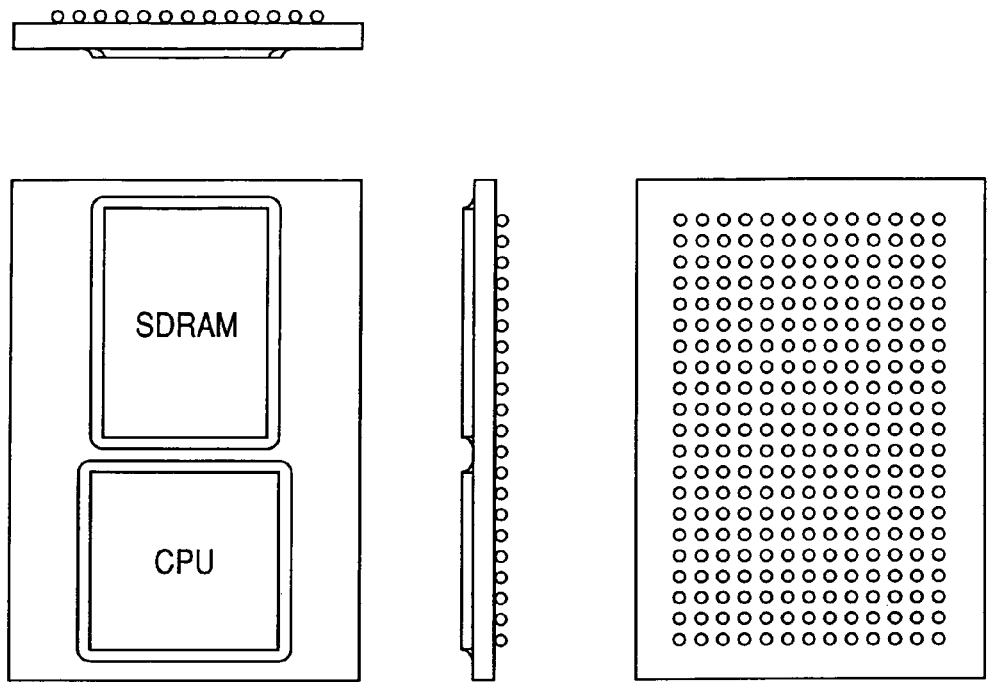
FIG. 12 is a configuration diagram showing a further embodiment of a multi chip module according to the present invention.
Figure 12B:
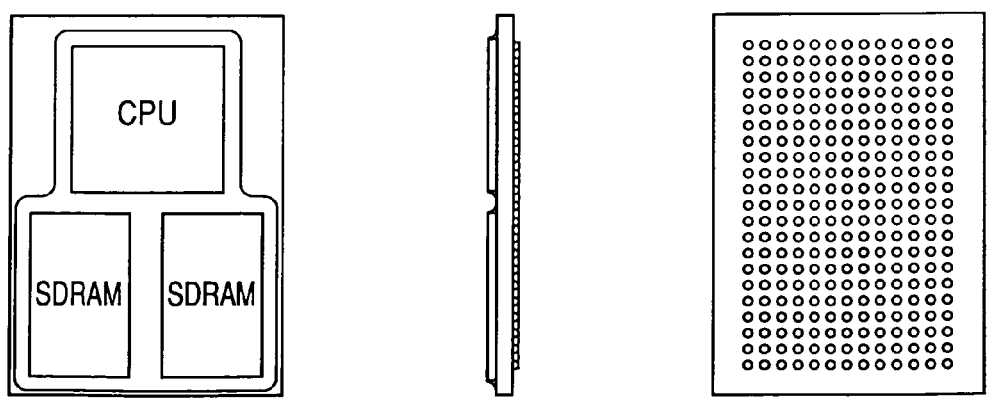

In the present embodiment, as described above, the control lines, address lines and data lines necessary for access to the SDRAMs respectively serve as the terminals of the multi chip module as ones for signals common to the CPU. Of these, only the CKE terminal for controlling each SDRAM to a halt condition is drawn as an external terminal MCKE of the multi chip module MCM, independent of the CPU. Therefore, the CKE terminal of the CPU is connected to its corresponding external terminal CKE of the multi chip module MCM. In a normal state, the CKE terminal of the CPU and the MCKE terminal of the SDRAM are interconnected with each other and used outside the multi chip module. The CKE terminal and MCKE terminal serve as adjacent terminals of such external terminals arranged in matrix form as shown in FIGS. 10 through 12 to be used later. Thus, an external connection path in the normal use of the CKE terminal and the MCKE terminal can be minimized.

A disable terminal for validating/invalidating the operation of the CPU is connected to its corresponding external terminal of the multi chip module MCM. A disable terminal of each SDRAM is of the CKE terminal, which in turn is connected to the external terminal MCKE of the multi chip module MCM.

In the SDRAM, the chip select terminal CSB gives instructions for starting a command input cycle in accordance with its low level. When the chip select terminal CSB is of a high level, (a chip non-selected state) and other inputs do not take on the meaning. However, a selected state of each memory bank to be described later, and internal operations such as a burst operation, etc. are not affected by the change to the chip non-selected state. The respective terminals for RASB, CASB and WEB are different in function from the corresponding signals at the normal DRAM and brought to signals significant when a command cycle to be described later is defined.

The clock enable terminal CKE corresponds to a signal indicating the validity of the next clock signal. If the terminal CKE is high in level, then the rising edge of the next clock signal CLK is made valid. When the terminal CKE is low in level, its rising edge is made invalid. Therefore, this terminal CKE functions as the disable terminal. The row address signal is defined in accordance with the level of an address signal in a row address strobe/bank active command cycle to be described later synchronized with the rising edge of the clock terminal CLK (or internal clock signal synchronized with it).

Address signals A12 and A13 are regarded as bank select signals in the row address strobe/bank active command cycle. That is, one of the four memory banks 0 through 3 provided in the SDRAM is selected according to a combination of A12 and A13. Although not restricted in particular, control on the selection of the memory banks can be performed by processes such as activation of only a row decoder on the selected memory bank side, all non-selection of column switch circuits on the non-selected memory bank side, connections to a data input circuit and a data output circuit on the selected memory bank side alone, etc.

A terminal BACK of the CPU is used for a bus use permission input (bus acknowledge signal), and BREQ is used for a bus use right request output (bus request signal). The CPU is provided with other signal control terminals. In the multi chip module MCM according to the present embodiment, the address buses, data buses and control buses are connected to their corresponding external terminals. Of these, CKE are respectively connected to the external terminals of the multi chip module without being directly connected between the CPU and SDRAMs. Paths used for signals transferred from the CPU to the SDRAMs are formed by connecting them outside the multi chip.

The CPU has the terminal CKE which holds an output when it is brought to a disable state by the terminal CA and retains a low level. On the other hand, each SDRAM has no terminal that holds an output when it is brought to a disable state by the terminal CKE.

A method for testing the multi chip module MCM according to the present embodiment is as follows: When the CPU is tested, the CKE is connected to a tester, the MCKE is connected to a ground potential (GND), a RESETP (unillustrated reset terminal) is connected to the tester, and the CA is connected to the tester. Also the tester is connected to the external terminals corresponding to the address buses, data buses and control buses of the multi chip module MCM. A test is performed between the tester and the CPU in a one-to-one relationship.

Although not restricted in particular, the CPU chip itself makes use of one that constitutes one semiconductor device. Since a test device having a test program to execute probing and a test subsequent to the assembly of the CPU chip exists for the CPU chip in this case, the CPU can be tested by using it as it is. Namely, the CPU mounted in the multi chip module can be tested while using the existing test device and test program as they are.

When an operation test for performing memory access of each SDRAM to the CPU is effected on the CPU, for example, the CPU performs the operation of supplying a clock CK to the SDRAM in accordance with the CKE and thereby issuing the command. At this time, the CKE is not transferred to the built-in SDRAM as described above but to the tester. Therefore, a virtual memory on the tester side is accessed so that a read/write operation is executed. Namely, since the CPU regards the tester as the SDRAM and performs memory access, its test can be carried out. If the CKE terminal of the CPU and the CKE terminal of the SDRAM are connected within the multi chip module, then the built-in SDRAM responds upon the above operation test of the CPU and outputs a read signal onto the corresponding data bus. Therefore, a collision between undesired signals occurs so that the test device and test program cannot be used, and such an operation test of CPU as to access the corresponding SDRAM cannot be carried out.

When the SDRAM is tested, the CKE is made open, the MCKE is connected to the tester, the RESETP is connected to the ground potential, and the CA is connected to the ground potential. Thus, the CPU is brought to a disable state so that the CKE terminal is fixed to a low level. However, the SDRAM can be tested in a state of being separated from the CPU by supplying a clock enable signal from the tester to the MCKE terminal. If the SDRAM is made up of the same chip as the general-purpose SDRAM even in this case, then a test corresponding to the existing test program can be carried out by the existing memory tester.

After the individual semiconductor chips have been judged to normally operate from the tests on the semiconductor chips, an operation test on the whole multi chip module may be carried out. That is, when the test is made on the whole multi chip module, the CKE is connected to the tester, the MCKE is connected to the CKE, the RESETP is connected to the tester, and the CA is connected to the tester. Thus, the CPU causes the corresponding SDRAM to perform write or read memory access. The CPU is caused to release the right of use of a bus, and the test device acquire the bus use right and obtains access to the SDRAM to thereby read its data, for example, whereby the writing/reading of data between the CPU and SDRAM matched to an actual operating state can be confirmed.

Figure 2:
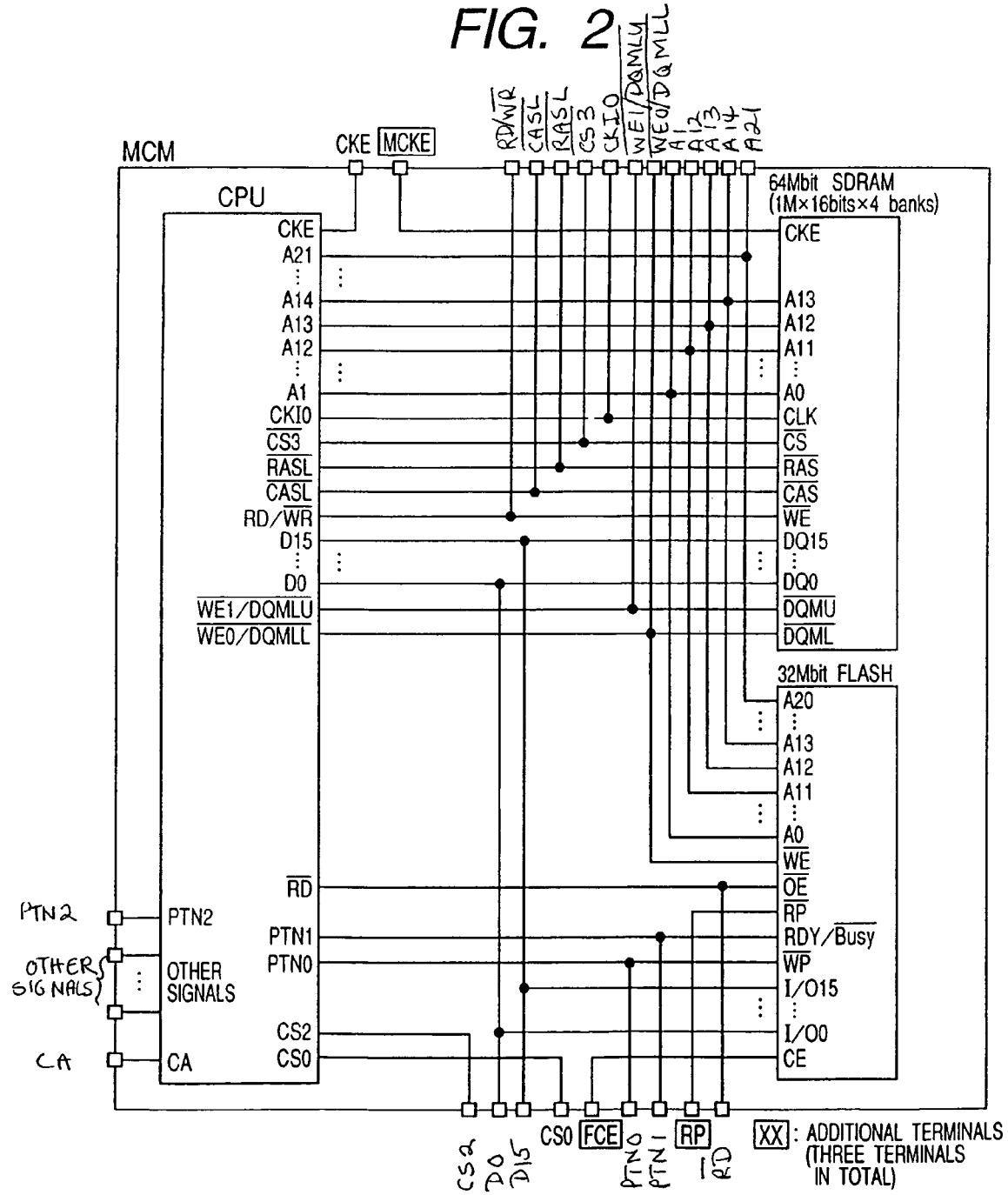
FIG. 2 is a schematic block diagram for describing another embodiment illustrative of a semiconductor device according to the present invention and its test method.

A schematic block diagram for describing another embodiment illustrative of a semiconductor device according to the present invention, and its test method is shown in FIG. 2. A multi chip module MCM according to the present embodiment comprises the CPU, one SDRAM and one flash EEPROM (Flash Electrically Erasable and Programmable Read Only Memory; hereinafter called simply FLASH memory). The one SDRAM has a memory capacity of about 64 Mbits comprising 1M (Mega)×16 bits×4 banks, and the FLASH memory has a memory capacity of 32 Mbits and has data terminals comprising 16 bits.

In order to enable a test with a high degree of reliability while taking advantage of the characteristics of the multi chip module MCM in which such a CPU, a SDRAM and a FLASH memory are combined with each other, the CPU (chip for microcomputer), SDAM and FLASH memory are interconnected with address buses, data buses and control buses formed in a mounting board or substrate constituting the multi chip module MCM. For instance, the address buses comprise 21 address buses associated with address terminals A0 through A20 of the FLASH memory, and the data buses comprises 16 data buses associated with data terminals DQ0 through DQ15 of the SDRAM and data terminals I/O0 through I/O15 of the FLASH memory. In the CPU, address terminals of A1 through A21 are respectively connected to the above address buses, and D0 through 15 are respectively connected to the above data buses. Address buses A1 through A14 of the CPU are connected to their corresponding address buses A0 through A13 of the SDRAM.

The CPU has respective control output terminals of CKI0, CS3B, RASLB, CASLB, RD/WRB, and WE1B/DQMLUB and WEOB/DQMLLB associated with the SDRAM. Except that a CKE is led to an external terminal as in the embodiment shown in FIG. 1, others are connected to their corresponding CLK, CSB, RASB, CASB, WEB, and DQMU and DQBL of the SDRAM in the same manner as described above. The CPU has an RDB, a PTN1, a PTN0 and a CS0 associated with the FLASH memory. They are connected to their corresponding OEB, RDY/BusyB, and WPB of the FLASH memory. The FLASH memory has a reset power-down terminal RPB and a chip enable terminal CE, which are connected to external terminals PR and FCE respectively. A CS2 of the CPU is led to an external terminal. Here, those whose terminal names are marked with B, respectively correspond to logic symbols which take low levels represented by placing over bars on the terminal names as active levels on the drawing in the same manner as described above.

Even in the present embodiment, as described above, control lines, address lines and data lines necessary for access to the SDRAM and FLASH memory respectively serve as the external terminals of the multi chip module as ones for signals common to the CPU. Of these, only the CKE terminal for controlling the SDRAM to a halt condition is drawn as an external terminal MCKE of the multi chip module MCM, independent of the CPU. Therefore, the CKE terminal of the CPU is connected to its corresponding external terminal CKE of the multi chip module MCM. In a normal state, the CKE terminal of the CPU and the MCKE terminal of the SDRAM are interconnected with each other and used outside the multi chip module.

A disable terminal for validating/invalidating the operation of the CPU is a CA terminal for the CPU, which is connected to its corresponding external terminal of the multi chip module MCM. A disable terminal of the SDRAM is of the CKE terminal, which in turn is connected to the external terminal MCKE of the multi chip module MCM. Further, disable terminals for validating/invalidating the operation of the flash memory are of the reset power-down terminal RPB and chip enable terminal CE, which are connected to their corresponding external terminals RP and ECE.

As described above, the control lines, address lines and data lines necessary for access to the CPU, SDRAM and FLASH memory respectively serve as terminals of the multi chip module as ones for signals common to the CPU. Of these, the MCKE terminal for controlling the SDRAM to a halt condition, and the RP terminal for controlling the FLASH memory to a halt condition are drawn as their corresponding external terminals of the multi chip module, independent of the CPU.

A method for testing the multi chip module MCM according to the present embodiment is as follows: When the CPU is singly tested, the CKE is connected to a tester, the MCKE is connected to a ground potential (GND), the RP terminal is connected to the ground potential, the CS0 and CS2 are connected to the tester, the FCE is connected to the tester, and the CA is connected to the tester. Thus, even if an attempt to access the SDRAM and FLASH memory is made upon the operation test of the CPU, these built-in memories do not respond in a manner similar to the embodiment shown in FIG. 1, and hence a virtual memory or the like provided in the tester is accessed.

In a method for testing the SDRAM, the CKE is made open, the MCKE is connected to the tester, the PR is connected to a power supply voltage VCC, the CS0 and CS2 are connected to the tester, the FCE is connected to the power supply voltage VCC, and the CA is connected to the ground potential. Thus, the tester is capable of singly operating the SDRAM by use of the MCKE terminal in a manner similar to the embodiment of FIG. 1.

In a method for testing the FLASH memory, the CKE is made open, the MCKE is connected to the ground potential GND, the PR is connected to the tester, and the CS0 and CS2 are connected to the power supply voltage VCC. The FCE is connected to the tester, and the CA is connected to the ground potential. Thus, the tester is capable of singly operating the FLASH memory, using the FCE terminal.

There are two methods for testing the whole multi chip module MCM. One of them is the same as in the normal use state and is based on the premise that a program has been stored in the FLASH memory. A memory connected to the CS0 terminal of the CPU is handled as a boot memory. After the release of reset to the CPU, a program fetch is first effected on the boot (Boot) memory. In this case, the CKE is connected to a tester, the MCKE is connected outside to the CKE, the RP, CS0 and CS2 are connected to the tester, the FCE is connected outside to the CS0, and the CA is connected to the tester. One of others is one for testing. After the release of reset to the CPU, a program fetch is first effected on a virtual memory on the tester side. In this case, the FCE may be switched from the CS0 to the CS2 in the normal state.

In the present embodiment, no program or the like is stored in the FLASH memory when the whole MCM is tested. Therefore, if the FCE is connected to the CS2, and the CPU is reset to release it, then the virtual memory on the tester side is started up or driven from the CPU so that its operation corresponding to it can be performed. Of course, it can be also confirmed that if a program is written into the FLASH memory, the CS0 is connected to the FCE and the CPU is reset to release it, then the CPU is operated in accordance with the program stored in the FLASH memory.

Since the disable terminals of the FLASH memory comprise two of the CE terminal, and the RP terminal other than the CE terminal, both are connected to their corresponding external terminals in the present embodiment. However, any one of them may be provided as the external terminal. Namely, either the CE or the RP may be set to the power supply voltage VCC when the CPU or SDRAM is singly tested.

Figure 3:
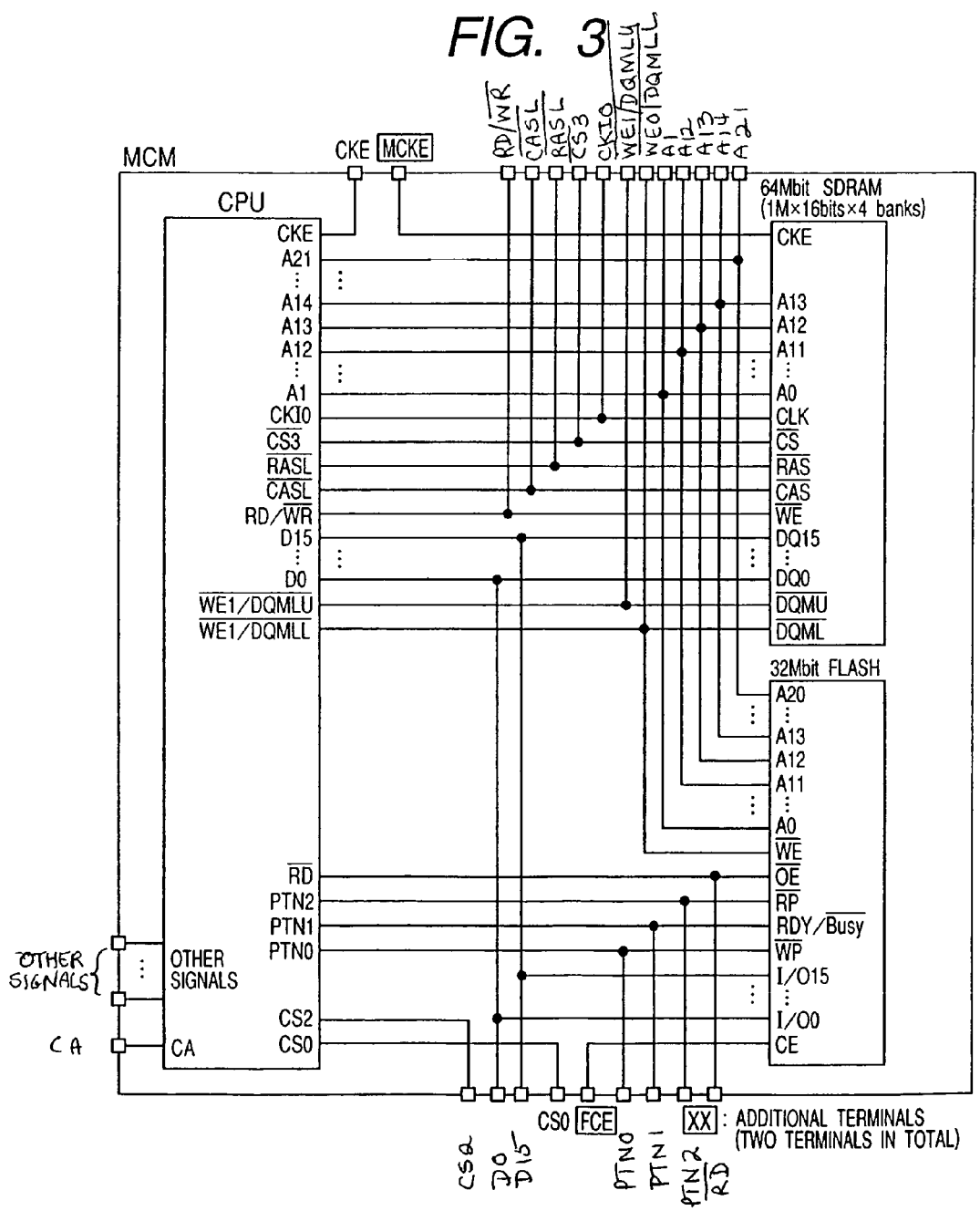
FIG. 3 is a schematic block diagram for describing a further embodiment illustrative of a semiconductor device according to the present invention and its test method.
Figure 4:
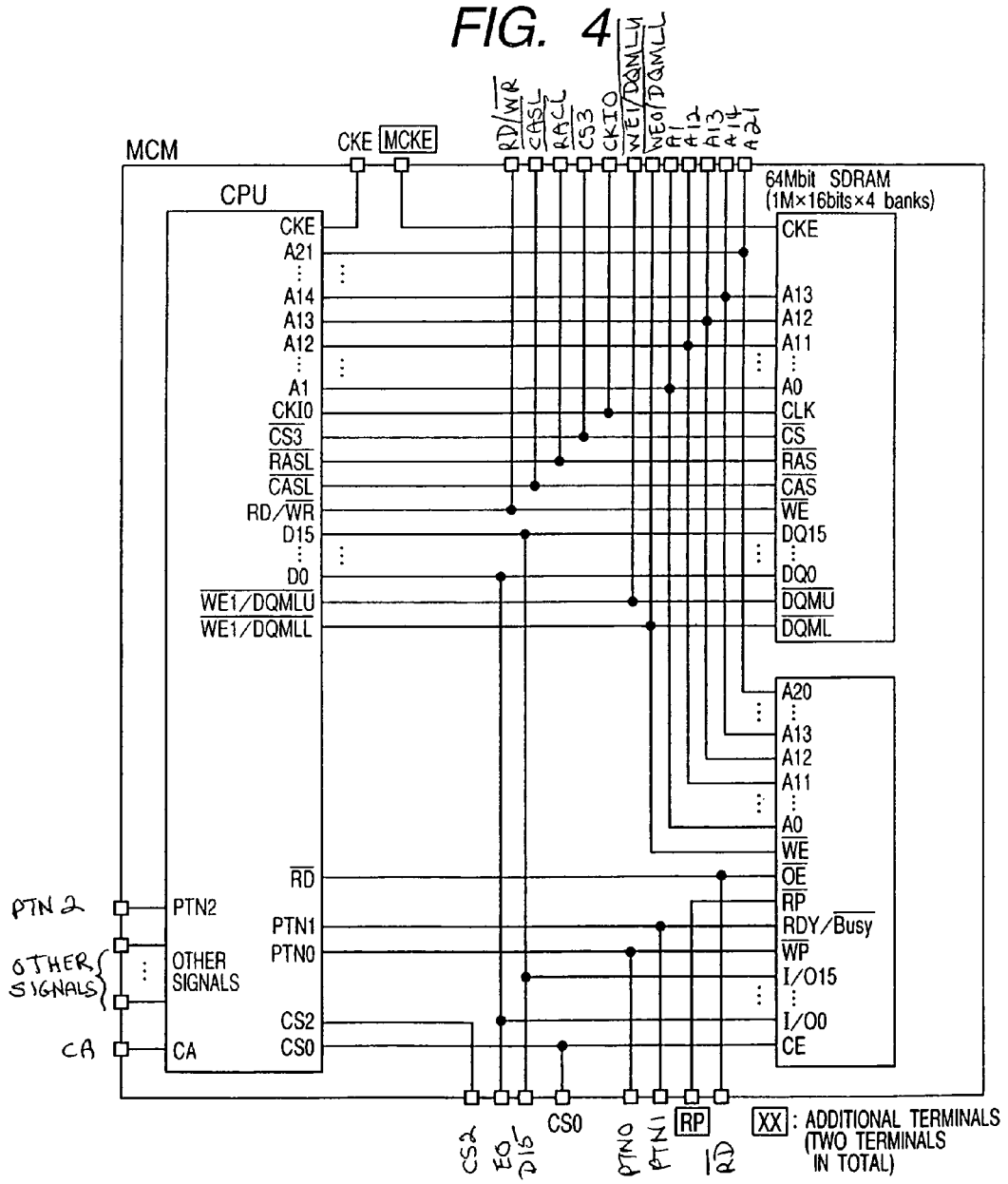
FIG. 4 is a schematic block diagram for describing yet another embodiment illustrative of a semiconductor device according to the present invention and its test method.

A schematic block diagram for describing a further embodiment illustrative of a semiconductor device according to the present invention and its test method is shown in FIG. 3. A multi chip module MCM according to the present embodiment comprise a CPU, one SDRAM and one FLASH memory in a manner similar to FIG. 2. The present embodiment is a modification of the embodiment shown in FIG. 2 and different from the embodiment of FIG. 2 in that an RP terminal of the FLASH memory is connected to a PTN2 terminal of the CPU by an internal bus.

When the CPU is tested in a manner similar to the embodiment of FIG. 2, an MCKE terminal of the SDRAM is brought to a low level, and an FCE terminal of the FLASH memory is brought to a high level. When the SDRAM is tested, a CA terminal of the CPU is taken low in level, and the FCE terminal of the FLASH memory is taken high in level. When the interface between the CPU and SDRAM is tested, a CKE terminal of the CPU and the MCKE terminal of the SDRAM are connected to each other, and the FLCE terminal of the FLASH memory is brought to a high level. When the interface between the CPU and the FLASH memory is tested, a CS0 terminal of the CPU and the FCE terminal of the FLASH memory are connected to each other, and the MCKE terminal of the SDRAM is taken low in level. When the whole multi chip module is tested, the CKE terminal of the CPU and the MCKE terminal of the SDRAM are connected to each other, and a CS2 terminal of the CPU and the FCE terminal of the FLASH memory are connected to each other.

A memory connected to the CS0 terminal of the CPU is handled as a boot memory as described above. After the release of reset to the CPU, a program fetch is first effected on the boot memory. Since the program has normally been stored in the boot memory, a test program itself cannot be read in the case of the occurrence of a failure in the FLASH memory when the FLASH memory is connected to the CS0 terminal where the interface between the CPU and the FLASH memory is tested, whereby a sufficient test cannot be carried out. Therefore, the FCE terminal of the FLASH memory is connected to the CS2 terminal of the CPU in each of the embodiments shown in FIGS. 2 and 3, and thereby the test is enabled with the FLASH memory as a data storage memory.

When the CPU is singly tested, such a configuration that the CKE and CS0 are led to their corresponding external terminals and selectively connected outside to the SDRAM and FLASH memory, is taken. Therefore, even if such an operation test as to access the SDRAM and FLASH memory is effected on the CPU, the SDRAM and FLASH memory are in a disable state, thus resulting in access to say a virtual memory on the tester side, whereby the CPU can be singly tested.

A schematic block diagram for describing yet another embodiment illustrative of a semiconductor device according to the present invention and its test method is shown in FIG.

4. A multi chip module MCM according to the present embodiment comprises a CPU, one SDRAM and one FLASH memory in a manner similar to FIG. 2. In the present embodiment, an RP terminal is used as a disable terminal as an alternative to a CE terminal. Therefore, the CE terminal of the FLASH memory is connected inside to its corresponding CS0 of the CPU.

A method for testing the multi chip module MCM according to the present embodiment is as follows: When the CPU is singly tested, a CKE is connected to a tester, an MCKE is connected to a ground potential (GND), the RP terminal is connected to the ground potential GND, a CA is connected to the tester. Thus, even if an attempt to access the SDRAM and FLASH memory is made upon the operation test of the CPU, the SDRAM and FLASH memory are kept in a disable state according to the low levels of the MCKE and RP, and hence these built-in memories do not respond in a manner similar to the embodiment shown in FIG. 1, so that a virtual memory or the like provided in the tester is accessed.

In a method for testing the SDRAM, the CKE is made open, the MCKE is connected to the tester, the PR is connected to the ground potential GND, and the CA is connected to the ground potential. Thus, the tester is capable of singly operating the SDRAM by use of the MCKE terminal in a manner similar to the embodiment of FIG. 1. In a method for testing the FLASH memory, the CKE is made open, the MCKE is connected to the ground potential GND, the PR is connected to the tester, and the CA is connected to the ground potential. Thus, the tester supplies a high level to the RP terminal and supplies a chip enable signal from the CS0 terminal to thereby make it possible to singly operate the FLASH memory.

In a method for testing the whole multi chip module MCM, the CKE is connected to the tester, the MCKE is connected to the CKE, the RP is connected to the tester, and the CA is connected to the tester. In the present embodiment, the method is the same as in the normal use state, and the CS0 terminal of the CPU is connected to the CE terminal of the FLASH memory on the precondition that a program has been stored in the FLASH memory. Therefore, if the trend continues, then a program fetch is first effected on the FLASH memory after the release of reset to the CPU. However, if the RP terminal is set to the ground potential GND by the tester, then the FLASH memory is forcibly brought to a disable state. Thus, the CS0 terminal is in communication even with the tester side, so that a program fetch can be firstly effected on the virtual memory on the tester side. In this case, an FCE may be switched from the CS0 to the CS2 in the normal state.

In the present embodiment, no program or the like is stored in the FLASH memory when the RP terminal is controlled by the tester as described above and the whole MCM is tested. Therefore, if the RP terminal is set to a low level, and the CPU is reset to release it, then the memory on the tester side is driven from the CPU so that its operation corresponding to it can be performed. Of course, it can be also confirmed that if a program is written into the FLASH memory to bring the RP terminal to the high level and reset the CPU for releasing it, then the CPU is operated in response to the program stored in the FLASH memory.

Figure 5:
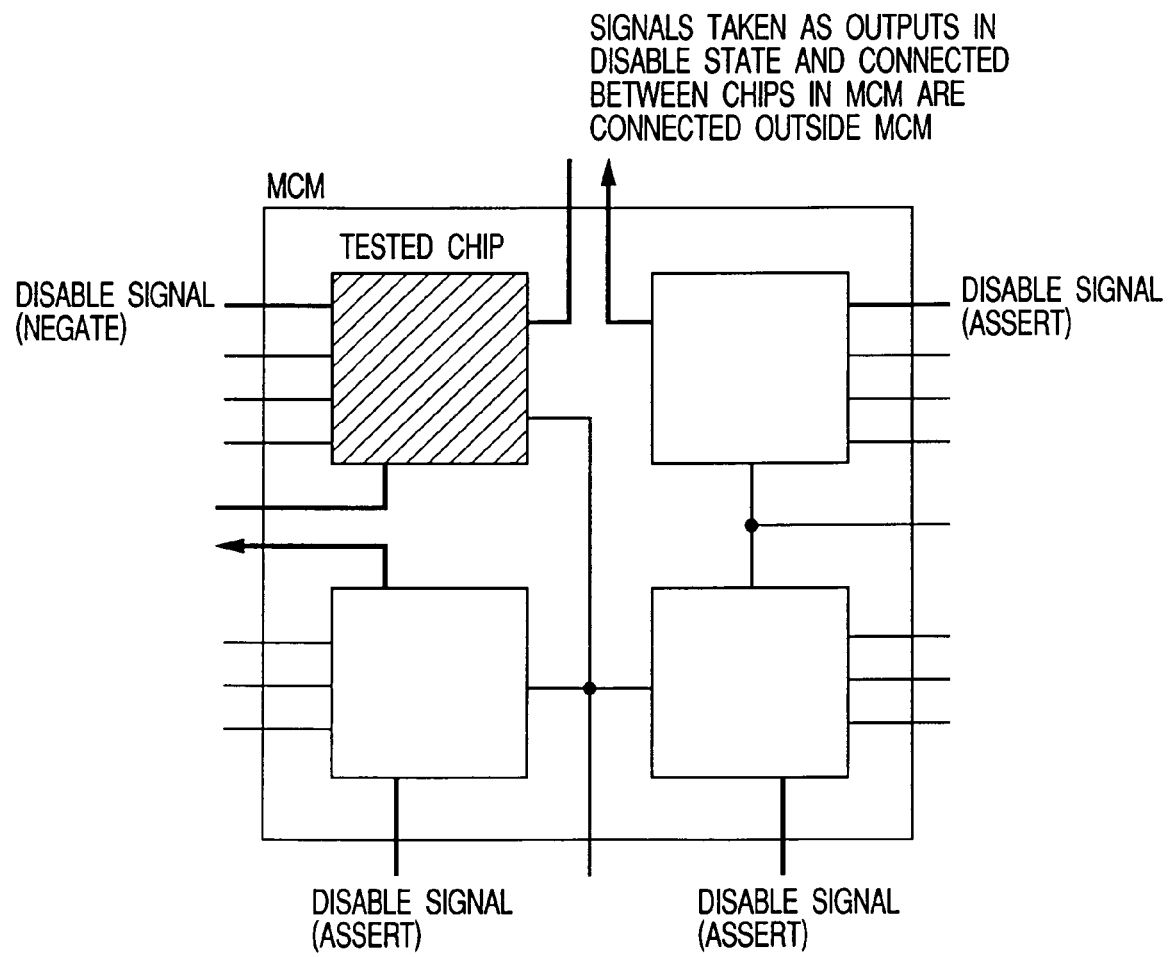
FIG. 5 is a block diagram showing one embodiment of a multi chip module according to the present invention.

A block diagram of one embodiment of a multi chip module according to the present invention is shown in FIG. 5. The present embodiment is one which typically illustrates the embodiments shown in FIGS. 1 through 4. As the form of the MCM, chips in the MCM are caused to independently have signals for individually bringing the chips in the MCM to a disable state. When their operations are closely related to one another and their output signals include ones for controlling the operations of other chips, only such a form will cause a failure in a single test. Therefore, such control signal lines are led to external terminals so as to be connected outside the MCM, and selective changes in signal paths at the external terminals are made to enable operation tests on the individual chips or mutual operation tests between the chips.

Figure 6:
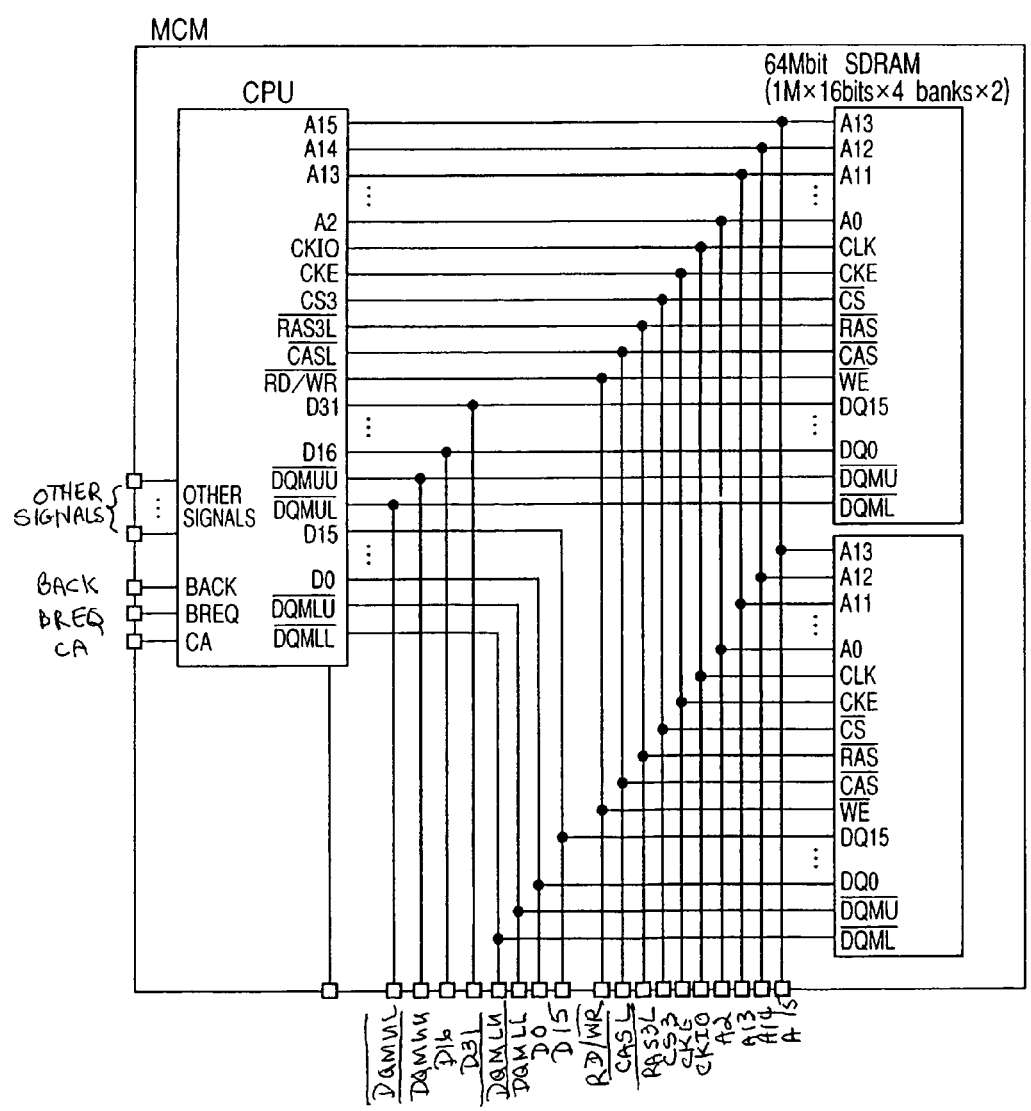
FIG. 6 is a schematic block diagram for describing a still further embodiment illustrative of a semiconductor device according to the present invention and its test method.

A schematic block diagram for describing a still further embodiment illustrative of a semiconductor device according to the present invention and its test method is shown in FIG. 6. A multi chip module MCM according to the present embodiment is a modification of the embodiment shown in FIG. 1. The MCKE terminals connected to the CKEs of the SDRAMs are deleted from the embodiment shown in FIG. 1, and a CKE of a CPU and CKEs of SDRAMs are directly connected to one another by internal buses.

In order to attempt to carry out a test similar to FIG. 1, the CPU is newly provided with a function and a terminal for testing. That is, when the CPU is brought to a test mode, it brings the CKE to an output high impedance state. Thus, the corresponding SDRAM can be brought to a disable state in accordance with a low level of the CKE supplied from an external terminal. When the CPU is singly tested, the CPU brings the CKE to the output high impedance state and outputs the CKE from a test terminal TCKE to a tester.

The tester is added with a bus request signal BREQ for requesting a bus release from the outside of the multi chip module MCM to the CPU, and a bus acknowledge signal BACK for notifying the reception of the bus release from the CPU to the outside of the multi chip module MCM. The CPU releases the bus in accordance with the assert of the bus request signal BREQ from the outside of the multi chip module MCM, and asserts the bus acknowledge signal BACK. In response to the assert of the bus acknowledge signal BACK, the CPU is capable of obtaining access from the tester corresponding to an external device of the multi chip module MCM to an internal memory through a terminal common to the CPU and the internal memory. Consequently, the memory mounted in the multi chip module is made equivalent to a normal package, and the same test as the normal package can be effected by the memory alone. At this time, the CKE terminal of the CPU is brought to an output high impedance state by the testing function.

As to an operation test made on the CPU independently, the tester sets the CKE of the SDRAM to a low level to thereby bring it to a disable state. At this time, a test for causing the CPU to perform memory access for the SDRAM is as follows. Since an enable signal is outputted from the TCKE to the tester, the memory of the tester is accessed as a virtual memory in the same manner as described above. Others are similar to the embodiment of FIG. 1. Since this configuration enables access to each memory in the multi chip module without involving the CPU even in actual use, the load on the execution of data transfer by the CPU can be lightened by a DMAC or the like provided outside.

The present invention provides a multi chip module MCM having a plurality of semiconductor chips mounted on a substrate as in the embodiment, wherein all the chips on the substrate are provided with disable signals, the disable signals other than one for the chip intended for testing are asserted to bring the chips other than the tested chip to a defunctioned or breakdown state, whereby the chip to be tested in the multi chip module MCM can be tested as a circuit equivalent to a normal package. Even when the chips are brought to the breakdown state at this time, they hold their output state, and signals connected to other chips are temporarily outputted out of the multi chip module MCM and connected outside the multi chip module.

By adding a small number of terminals to the multi chip module in this way, the chips mounted in the multi chip module can be individually tested with maintained noise characteristics without mounting the testing circuit within the chip or multi chip module as another chip. It is needless to say that the added testing terminals may preferably be disposed in the neighborhood of terminals destined for connection in terms of electrical characteristics.

In a multi chip module comprising a CPU or an ASIC (Application Specified Integrated Circuit), i.e., an application specific IC, and a memory, control lines, address lines and data lines necessary to access the memory from the CPU or ASIC are held in common, and a bus request signal for releasing a signal shared for the CPU or ASIC is provided and asserted from the outside of the multi chip module, thereby making it possible to access the memory in the multi chip module without involving the CPU or ASIC.

Incidentally, though it would be understood that the ASIC generally comprises an input/output circuit intended for specific application, and a logic circuit, a recent technical progress enables even a more complicated configuration including a processor including a plurality of central processing units, and its peripheral circuits.

Thus, the provision of a multi chip module having the same terminal arrangement or layout as a normal package for the CPU or ASIC, and the mere addition of a bus release routine of the CPU or ASIC to a test for a built-in memory makes it possible to appropriate or make use of test patterns of the normal package for the memory, whereby a test pattern creating period can be reduced.

Figure 7:
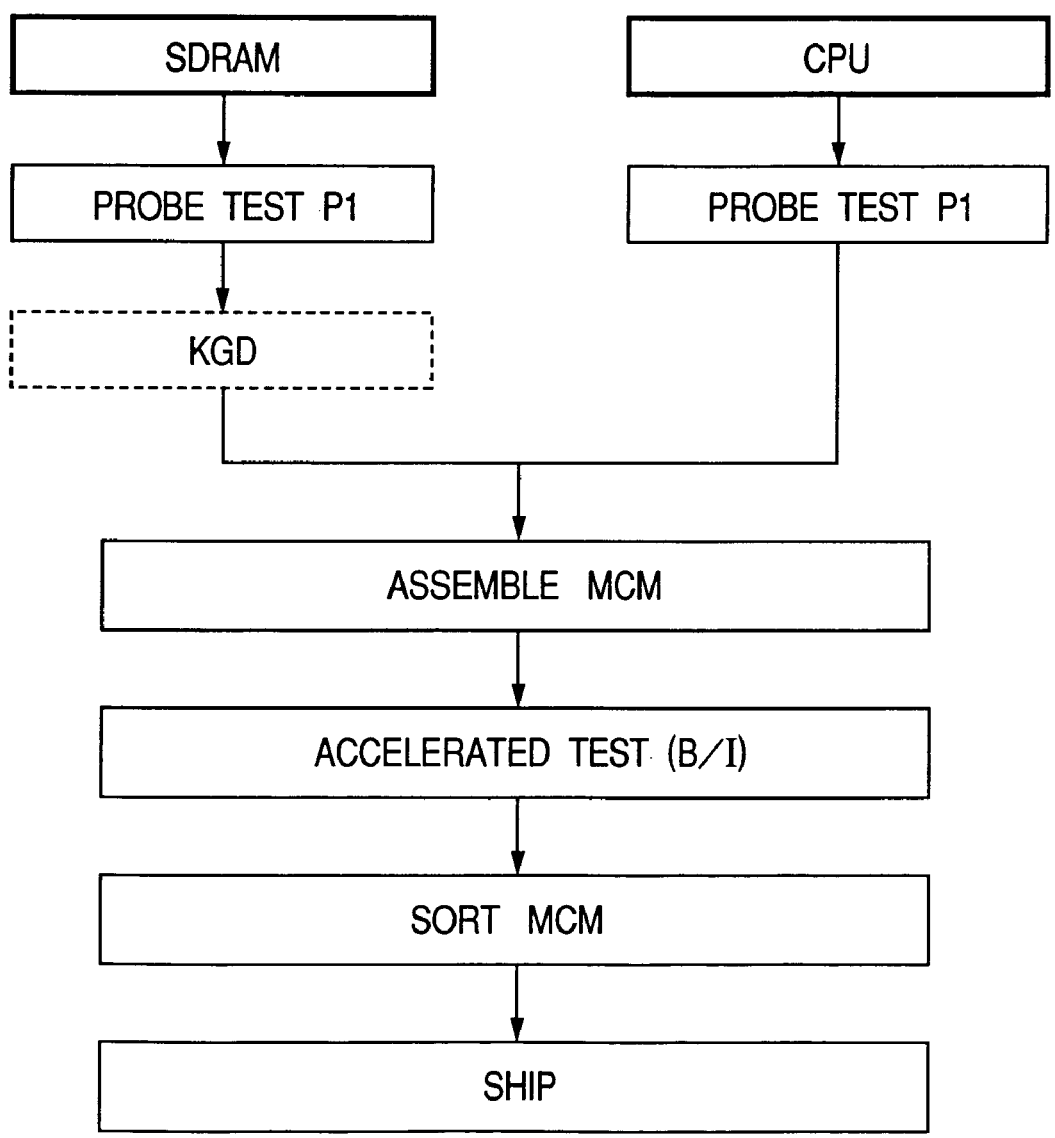
FIG. 7 is a flowchart for describing a method of manufacturing one embodiment of a multi chip module according to the present invention.

A flowchart for describing a method of manufacturing one embodiment of a multi chip module according to the present invention is shown in FIG. 7. When a memory like an SDRAM and a CPU are combined together to configure the MCM, non-defective chips are selected or sorted as the individual chips SDRAM and CPU by a probing test PI (high-temperature sorting).

The assembly of the MCM is carried out by the sorted SDRAM and CPU. After the assembly of the MCM, B/I is executed as an accelerated test for removing an initial failure in chip. Thereafter, a connection check, a full-function check, and an AC/DC check are carried out as the sorting of the MCM by using such a test method as referred to above. In such a configuration that the connection check, full-function check and AC/DC check are carried out in the state of the chips being assembled into the multi chip module as in the present embodiment, sorting at an equal or higher degree of reliability is enabled even without the use of a KGD (Known Good Die) for effecting a test equivalent to the normal package on the SDRAM in a bare chip state as indicated by a dotted line in the same figure.

Figure 8:
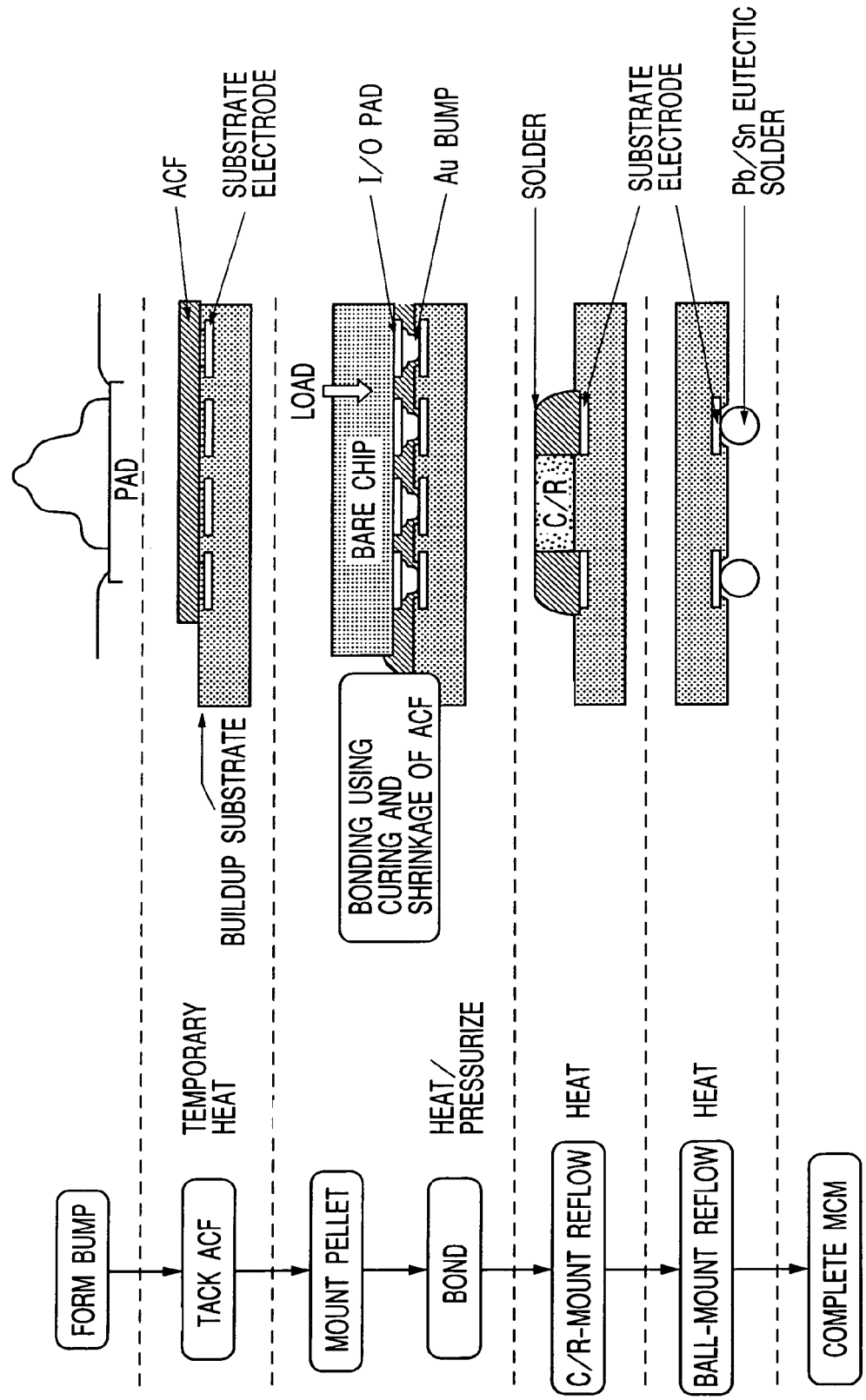
FIG. 8 is an explanatory diagram of an assembly process of a multi chip module employed in the present invention.

An explanatory diagram of an assembly process of a multi chip module is shown in FIG. 8. The assembly process, a heat history corresponding to it, and a schematic vertical structure are shown in the same drawing. Au bumps are respectively formed on pads of a bare chip. An anisotropic conductive film AFG is tacked on MCM substrate electrodes, and the bare chip formed with the Au bumps on the pads is mounted on an MCM substrate, followed by heating and bonding. Then a C/R (capacitor/resistor)-mount reflow is done and a reflow for mounting balls as external terminals is finally carried out to thereby form an MCM.

Figure 9:
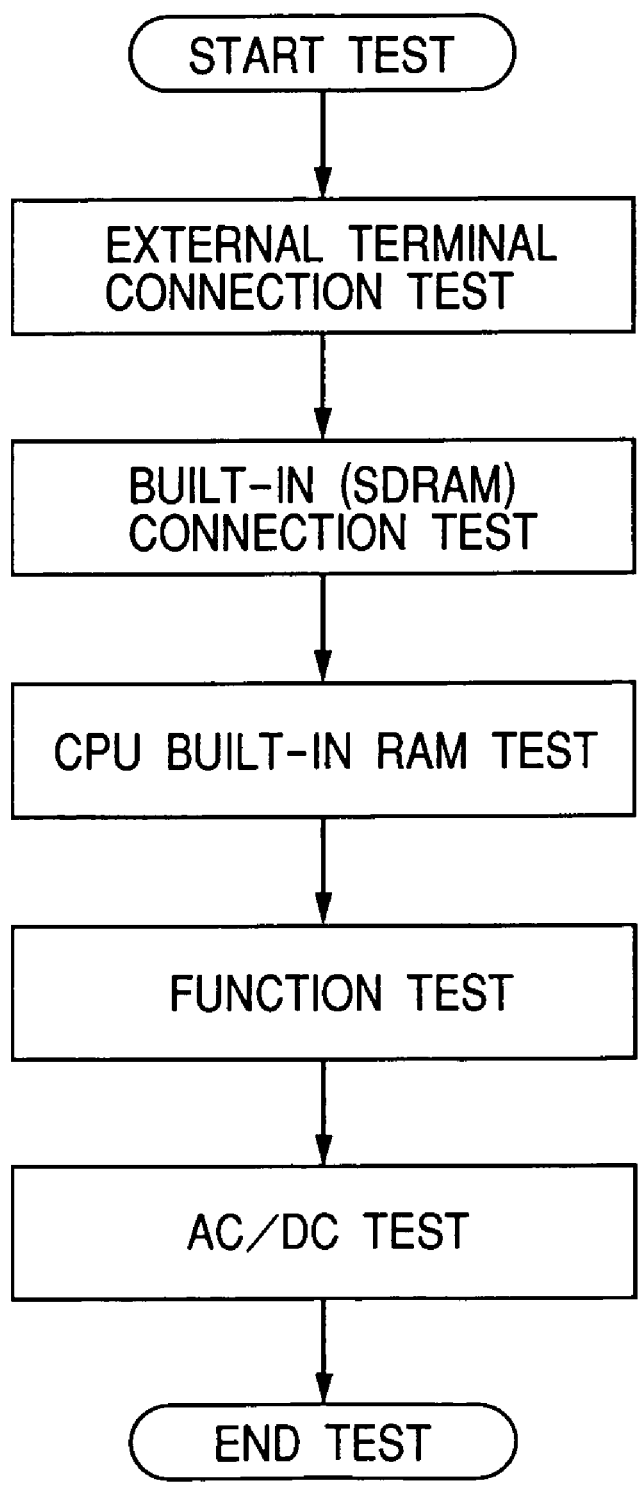
FIG. 9 is a flowchart showing one embodiment of a multi chip module test method of the present invention.

A flowchart showing one embodiment of a multi chip module test method of the present invention is shown in FIG. 9. In the present embodiment, an external terminal connection test on a multi chip module MCM is first carried out. Namely, a check is made to see whether connections between I/O pads and Au bumps and electrical connections at the ball-mount reflow have been properly performed in the assembly process shown in FIG. 8.

A test on connections between respective chips is next carried out. For example, the CPU is brought to a disable state and obtains access to the SDRAM alone to thereby test its connection to an external terminal. A test on the independent CPU is next carried out. Upon this test, a test on a RAM such as a cache memory built in the CPU is carried out with top priority. Namely, since a program is fetched into the cache memory to operate the CPU upon a test on the operation of the CPU, a test is made to see whether the cache memory (built-in RAM) properly operates as a presupposition therefor.

A function test is made on the CPU or SDRAM, or the FLASH memory or the like singly where the connection thereof to the external terminal is satisfactory as described above. At this time, a test on such a whole multi chip module as to carry out read/write from the CPU to the SDRAM or FLASH memory is also carried out. Thereafter, an AC/DC test is carried out and the test is completed.

When each of data buses provided in the multi chip module is wider than a data bus in the memory, and each of the data buses of the plurality of memories are outputted parallel from the multi chip module as in the embodiment of FIG. 1, the plurality of memories in the multi chip module are simultaneously tested to thereby make it possible to shorten a test time interval used as one for the multi chip module.

As the cause of a failure in multi chip module, a failure in connection at its mounting or implementation, or the like is first considered. In addition, a failure in the function of each chip, or the like due to stress at its implementation is considered. Accordingly, it is desirable that as to turns for carrying out tests, as shown in FIG. 9, a connection to each chip is tested and the functions of the respective chips are individually tested, followed by testing on the whole multi chip module.

A configuration diagram of one embodiment of a multi chip module according to the present invention is shown in FIG. 10. As shown in FIG. 10(B), a multi chip module comprising a CPU and an SDRAM is implemented by the same package as a normal package equipped with only a CPU as shown in FIG. 10(A). Namely, FIGS. 10(A) and 10(B) are defined as ones having the same terminal arrangements and sizes as viewed from outside. In other words, the CPU and SDRAM are mounted on the same package as the existing CPU to constitute the multi chip module. Thus, since a jig and a test pattern employed in the CPU of the normal package can be appropriated, the number of man-hours needed to start up a test can be reduced. Merely mounting the present multi chip module on a semiconductor circuit device which has been equipped with the normal package enables addition of memory capacity even in actual use.

A configuration diagram of another embodiment of a multi chip module according to the present invention is shown in FIG. 11. In the present embodiment, outward forms and terminal layouts are made equal among a plurality of multi chip modules different in memory type and capacity, and a jig and a test pattern are shared among them. Thus, the efficiency of manufacture and assembly can be enhanced, and the memory capacity can be added by simply replacing the multi chip module with another even in actual use as described above.

A configuration diagram of a further embodiment of a multi chip module according to the present invention is shown in FIG. 12. Even in the present embodiment, outward forms and terminal layouts are made equal among a plurality of multi chip modules different in memory type and capacity, and a jig and a test pattern are shared among them. Thus, the efficiency of manufacture and assembly can be improved, and the mere replacement of the multi chip module enables addition of memory capacity even in actual use as described above. While the chips and the mounting substrate are connected by wire bonding in the multi chip modules shown in FIGS. 10 and 11, IC pellets are respectively connected to a buildup substrate by the Au bumps as in the embodiment of FIG. 8 in the case of the embodiment shown in FIG. 12.

As in the present embodiment, a user simply changes the present multi chip module from the normal package to the corresponding multi chip module to thereby make it possible to cause the multi chip module to have the functions of the CPU or ASIC and each memory. It is needless to say that even if such a multi chip module that the same terminal layout/package is equipped with the memories different in capacity from the CPU or ASIC, is brought not only to the same terminal layout/package as the CP or ASIC serving as the base but also to a terminal layout/package identical between multi chip modules, a similar advantage is obtained.

According to the present embodiments as described above, the following advantages are obtained.

(1) An advantage is obtained in that a second semiconductor chip including the operation of receiving instructions as to an operation from a first semiconductor chip and outputting a signal corresponding to it, is mounted on a mounting means, and internal wirings for interconnecting the first and second semiconductor chips with each other and external terminals respectively connected to the internal wirings are provided in such mounting means to thereby constitute a multi chip module, and a signal path for selectively invalidating operation instructions from the first semiconductor chip to the second semiconductor chip is provided inside the module, whereby a high-reliability test on a single semiconductor chip is enabled while the performance of the multi chip module is being maintained.

(2) In addition to the above, an advantage is obtained in that the internal wiring for transferring the operation instructions directed from the first semiconductor chip to the second semiconductor chip is connected to a first external terminal, and an internal wiring extending from a second external terminal and for transferring operation instructions directed to the second semiconductor chip is connected to the second semiconductor chip, whereby a signal path for selectively invalidating operation instructions from the first semiconductor chip to the second semiconductor chip can be formed while maintaining the performance of a multi chip module owing to a simple configuration that the presence or absence of a connection between the first and second external terminals is determined.

(3) In addition to the above, an advantage is obtained in that the second semiconductor chip is caused to have a control terminal for neglecting operation instructions given from the first semiconductor chip, and such a control terminal is connected to its corresponding external terminal, whereby a high-reliability test on a single semiconductor chip is enabled while the performance of a multi chip module is being maintained.

(4) In addition to the above, an advantage is obtained in that control terminals for validating/invalidating the operations of the first and second semiconductor chips are provided therefor and connected to the external terminals respectively, whereby a high-reliability test on a single semiconductor chip and mutual tests between semiconductor chips can be carried out.

(5) In addition to the above, an advantage is obtained in that the first semiconductor chip is configured as a processor including a central processing unit, and the second semiconductor chip is configured as a memory circuit, whereby the speeding up and downsizing of a system including a microprocessor can be realized.

(6) In addition to the above, an advantage is obtained in that a plurality of random access memories and nonvolatile memories are included in the second semiconductor chip, whereby an easy-to-use multi chip module can be obtained.

(7) In addition to the above, an advantage is obtained in that the first semiconductor chip is directed to a product which constitutes one semiconductor device by itself, whereby the existing test device and test program can be used as they are.

(8) In addition to the above, an advantage is obtained in that a signal path for outputting a signal equivalent to the operation instructions relative to the second semiconductor chip to an external terminal instead of the operation instructions in accordance with the setting thereof to a specific operation mode is included in the first semiconductor chip, whereby a small number of external terminals enables a high-reliability test on a single semiconductor chip while maintaining the performance of a multi chip module.

(9) In addition to the above, an advantage is obtained in that the first semiconductor chip is caused to have a bus release function as a processor including a central processing unit, whereby an external test device obtains a bus right in place of the central processing unit to enable a test on each peripheral circuit.

(10) An advantage is obtained in that a method of testing a semiconductor device wherein a second semiconductor chip including the operation of receiving instructions as to an operation from the first semiconductor chip and outputting a signal corresponding thereto is mounted on a mounting means, internal wirings for interconnecting the first and second semiconductor chips with each other and external terminals respectively connected to the internal connections are provided in the mounting means to configure a multi chip module, and a signal path for selectively invalidating operation instructions from the first semiconductor chip to the second semiconductor chip is provided inside the module, which comprises the steps of invalidating the operation instructions from the first semiconductor chip to the second semiconductor chip, and carrying out an operation test directed from the first semiconductor chip to the second semiconductor chip between the first semiconductor chip and a test device connected to the external terminal, whereby a high-reliability test on a single semiconductor chip can be carried out while maintaining the performance of the multi chip module.

(11) In addition to the above, an advantage is obtained in that a test on connections between the first semiconductor chip or second semiconductor chip and the external terminals is carried out, and other operation tests including an operation timing test on the first semiconductor chip or the second semiconductor chip is carried out on the condition that no failure in connection occurs, whereby an efficient defective/non-defective decision can be performed.

While the invention developed above by the present inventors has been described specifically by the illustrated embodiments, the present invention is not limited to the embodiments. Various changes can be made thereto within the scope not departing from the substance thereof. As the multi chip module, for example, one in which a processor such as a digital signal processor (DSP) operated in cooperation with a CPU is also mounted, may be adopted. Since control signals for operating both in close association with each other are provided in this case, signal lines associated with the control signals may be set so as to form signal transfer paths by interconnecting the external terminals as described above. By doing so, the operations associated with each other between the CPU and the DPS can be carried out as an alternative to between the CPU and a test device and between the DSP and the test device.

A semiconductor chip for a multi chip module, having surface-mountable electrodes may be one regarded as a semiconductor chip having a CSP configuration, or a broad bare chip like a semiconductor device completed by forming and substantially sealing necessary terminals, wirings and terminals in a state of a semiconductor wafer called a WPP (Wafer Process Package), and thereafter performing a chip division, along with a so-called bare chip. As the semiconductor chip, a chip having an inner-surface mounting configuration may preferably be used in that a region for electrical connection to a mounting substrate cannot be substantially set within the range of the semiconductor chip, and a sufficient size reduction in multi chip module is enabled. The present invention is occasionally suitable for the case in which as in a surface-mounted semiconductor chip, electrodes thereof are hidden by the semiconductor itself, and internal wirings on a mounting substrate are also hidden behind its multilayered wiring.

A semiconductor chip may be selected not only from surface-mounted semiconductor chips but also from semiconductor chips whose some or all are adaptable to a wire bonding technology, in such a manner as to be able to meet one characteristic of a multi chip module in which the use of the existing semiconductor chips is also taken into consideration in terms of shortening of turn around time from its design to manufacture. When the surface-mounted semiconductor chip and the wire bonding-adaptable semiconductor chip are mixed together, a mounting substrate includes, for example, a land used for the surface-mounted semiconductor chip, an area for bonding the wire bonding-adaptable semiconductor chip, and wire bonding electrodes, all of which are set to one main surface of the mounting substrate. A plurality of bump electrodes each having a relatively large size, which are used as external terminals similar to the above embodiment, are set to the other main surface of the mounting substrate. The wire bonding-adaptable semiconductor chip is adhered and fixed to the area of the mounting substrate with an adhesive. Bonding pad electrodes of the semiconductor chip and electrodes of the mounting substrate are electrically connected to one another by connector wires using the wire bonding technology.

The multi chip module may be one using such a multilayer-constituted semiconductor chip that memory chips are laminated on a semiconductor chip constituting a CPU. Alternatively, it may be one in which semiconductor chips are mounted on both surfaces of a mounting substrate.

INDUSTRIAL APPLICABILITY

The present invention can be widely used as a semiconductor device constituting a multi chip module, and its test method.

The invention claimed is:
1. A semiconductor device comprising:
a plurality of first external terminals;
a plurality of second external terminals;
a third external terminal;
a fourth external terminal;
a first semiconductor chip coupled to the plurality of first external terminals, the plurality of second external terminals, and the third external terminal; and
a second semiconductor chip coupled to the plurality of second external terminals and the fourth external terminal,
wherein the third external terminal is configured to output a first signal from the first semiconductor chip to an outside of the semiconductor device, the first signal designating whether a corresponding operation of the second semiconductor chip is valid, and
wherein the fourth external terminal is configured to input a second signal from the outside of the semiconductor device to the second semiconductor chip, the second signal designating whether a corresponding operation of the second semiconductor chip is valid.
2. A semiconductor device according to claim 1, further comprising a substrate having:
a first surface mounting the first semiconductor chip and the second semiconductor chip, and
a second surface on which the plurality of first external terminals, the plurality of second external terminals, the third external terminal, and the fourth external terminal are formed,
wherein the third external terminal and the fourth external terminal are arranged adjacent to each other.
3. A semiconductor device according to claim 1,
wherein the first semiconductor chip comprises a processor,
wherein the second semiconductor chip comprises one or more synchronous dynamic random access memory components,
wherein the first signal is a clock enable signal provided from the processor, and
wherein the second signal is a clock enable signal being supplied to the one or more synchronous dynamic random access memory components.
4. A semiconductor device according to claim 3,
wherein the plurality of first external terminals includes a fifth external terminal configured to input a disable signal for disabling an operation of the processor.
5. A semiconductor device according to claim 1,
wherein the first semiconductor chip comprises a processor,
wherein the second semiconductor chip comprises a flash memory component,
wherein the first signal is a chip select signal provided from the processor, and
wherein the second signal is a chip enable signal being supplied to the flash memory component.

* * * * *